United States Patent
Vashchenko et al.

(10) Patent No.: US 7,145,187 B1
(45) Date of Patent: Dec. 5, 2006

(54) SUBSTRATE INDEPENDENT MULTIPLE INPUT BI-DIRECTIONAL ESD PROTECTION STRUCTURE

(75) Inventors: Vladislav Vashchenko, Palo Alto, CA (US); Peter J. Hopper, San Jose, CA (US); Philipp Lindorfer, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 101 days.

(21) Appl. No.: 10/735,500

(22) Filed: Dec. 12, 2003

(51) Int. Cl.
| | |
|---|---|
| H01L 27/108 | (2006.01) |
| H01L 29/76 | (2006.01) |
| H01L 23/62 | (2006.01) |
| H01L 21/8238 | (2006.01) |
| G11B 5/33 | (2006.01) |
| H02H 9/00 | (2006.01) |

(52) U.S. Cl. .................. 257/173; 257/297; 257/328; 257/355; 257/360; 438/223; 438/224; 438/225; 438/226; 438/227; 438/228; 360/323; 361/56

(58) Field of Classification Search .............. 257/173, 257/297, 328, 355, 360; 438/223, 224, 225, 438/226, 227, 228; 360/323; 361/56
See application file for complete search history.

(56) References Cited

U.S. PATENT DOCUMENTS

| | | | | |
|---|---|---|---|---|
| 4,717,686 | A * | 1/1988 | Jacobs et al. | 438/207 |
| 5,763,918 | A * | 6/1998 | El-Kareh et al. | 257/355 |
| 6,194,764 | B1 * | 2/2001 | Gossner et al. | 257/355 |
| 2003/0197242 | A1 * | 10/2003 | Chen et al. | 257/509 |
| 2004/0114287 | A1 * | 6/2004 | Salling et al. | 361/56 |
| 2004/0135141 | A1 * | 7/2004 | Pequignot et al. | 257/46 |
| 2005/0045909 | A1 * | 3/2005 | Zhang | 257/173 |

* cited by examiner

*Primary Examiner*—Carl Whitehead, Jr.
*Assistant Examiner*—James M. Mitchell
(74) *Attorney, Agent, or Firm*—Jurgen Vollrath

(57) ABSTRACT

In a multiple input ESD protection structure, the inputs are isolated from the substrate by highly doped regions of opposite polarity to the input regions. Dual polarity is achieved by providing a symmetrical structure with n+ and p+ regions forming each dual polarity input. The inputs are formed in a p-well which, in turn, is formed in a n-well. Each dual polarity input is isolated by a PBL under the p-well, and a NISO underneath the n-well. An isolation ring separates and surrounds the inputs. The isolation ring comprises a p+ ring or a p+ region, n+ region, and p+ region formed into adjacent rings.

4 Claims, 3 Drawing Sheets

SUBSTRATE INDEPENDENT MULTIPLE INPUT BI-DIRECTIONAL ESD PROTECTION STRUCTURE

FIELD OF THE INVENTION

The invention relates to ESD protection structures. In particular it relates to protection structures capable of protecting two or more inputs against ESD events.

BACKGROUND OF THE INVENTION

In dealing with ESD protection several factors invariably impact the choice and structure of the protection structure. Typical factors that need to be considered in providing ESD protection for a circuit, include the triggering and breakdown voltage of the ESD device, its holding voltage, current handling capabilities, and ability to handle positive and negative voltage pulses. These diverse requirements can best be understood by way of example.

For instance, one common ESD protection structure is the silicon-controlled rectifier (SCR) shown in FIG. 1, which includes an n-well 100 formed in a p-substrate 102. A p+ and an n+ region 110, 112 are formed in the n-well and are typically connected to define an anode. A p+ and an n+ region 120, 122 are also formed in the p-substrate 102 to define a cathode. This device provides excellent protection against high current during ESD events. One of the advantages of SCR 100 over other ESD protection devices, such as a grounded-gate MOS transistor, is the double injection of carriers, which provides current densities (after snapback) that are about ten times greater than the densities provided by a grounded-gate MOS device.

One of the disadvantages of a SCR, however, is that a very large positive voltage, e.g., 50 volts, must be dropped across its nodes before the junction breaks down. As a result, SCRs can not be used to protect devices, such as MOS transistors, that can be permanently damaged by much lower voltages, e.g., 15 volts.

A solution proposed in the past, was to use low voltage silicon controlled rectifiers (LVTSCRS) which are not only smaller but allow the reaching of current densities, after snap back, that are some ten times higher than the current densities of traditionally used grounded gate NMOS devices (GGNMOS), thus increasing the ESD protection capability for CMOS circuits.

However conventional LVTSCRs also have their limitations. For instance, they fail to address yet another concern in designing ESD protection devices, namely the ability to accommodate both positive and negative polarity voltage pulses. Situations present themselves where bi-directional voltage swings need to be handled. One scenario is in the case where the power circuit is working on inductive loads. Here both negative and positive voltage waveforms can be produced. For example, in order to detect small signals from a power circuit, it is common to make use of differential amplifiers that include inductive loads as shown in FIG. 2. The circuit in FIG. 2 shows a differential amplifier 200 measuring the voltage between two input pads 210, 212. In this circuit, the one input pad 210 is provided with an inductive load 204. To protect the circuit against ESD pulses on either one of the input pads, an ESD protection circuit 202 is provided. This has to be able to handle both positive and negative voltage pulses on the two input pads.

In the case of high voltage applications, the ESD protection structure has to be able to handle high voltages without triggering. This need for a high voltage solution is becoming particularly acute in the motor vehicle industry where the number of electronic components is not only increasing but a new high voltage standard of 42V is being promoted.

Furthermore, in order to avoid interference with the circuit signal and ensure good accuracy it is desirable that the input to the analog circuit have no body diode.

It will thus be appreciated that, the diverse requirements are not necessarily present in one structure, thus requiring that new structures be created.

SUMMARY OF THE INVENTION

According to the invention, there is provided a multiple input ESD protection, comprising a first p-well formed in a first n-well, a second p-well formed in a second n-well, an isolation ring between the n-wells and extending around the two n-wells, a first input region formed in the first p-well, a second input region formed in the second p-well, a contact to the first input region, a contact to the second input region, and a contact to the isolation ring. For purposes of this application, the term contact will be used broadly to refer to the means for contacting the input region. Thus it will include both the polysilicon contact region and the metal contact to the polysilicon contact region. For simplicity, the metal layers and metal contact regions are not shown in the embodiments even though they form part of the contact.

The isolation ring can be a p+ region or a combination of a first p+ region, a n+ region, and a second p+ region formed adjacent to each other and extending around the n-wells. The isolation ring may be formed in a p-well and may have a p-buried layer (PBL) formed below the p-well of the isolation ring.

An n-isolation region (NISO) may be formed beneath one or both of the n-wells. A p-buried layer (PBL) may be formed beneath one or both of the p-wells.

One or both of the first and second input regions may include a p+ region and an n+ region. Instead the first input region may include only a p+ region or only a n+ region and the second input region may have both a n+ and a p+ region or only a region of opposite polarity to that of the first input.

Further, according to the invention, there is provided an ESD protection device that comprises a structure as defined above, wherein the isolation ring is connected to ground or is biased to a predefined voltage.

DETAILED DESCRIPTION OF THE INVENTION

The present invention provides a new bi-directional structure and an ESD protection device making use of the structure that provides for positive and negative voltage swings on the input pads. Furthermore, the present invention provides for ESD protection on more than one input pin, and provides for independent operation relative to the substrate by including substrate isolation. For instance, as will be described in more detail below, an isolation ring is provided to isolate the substrate.

Figure 3:
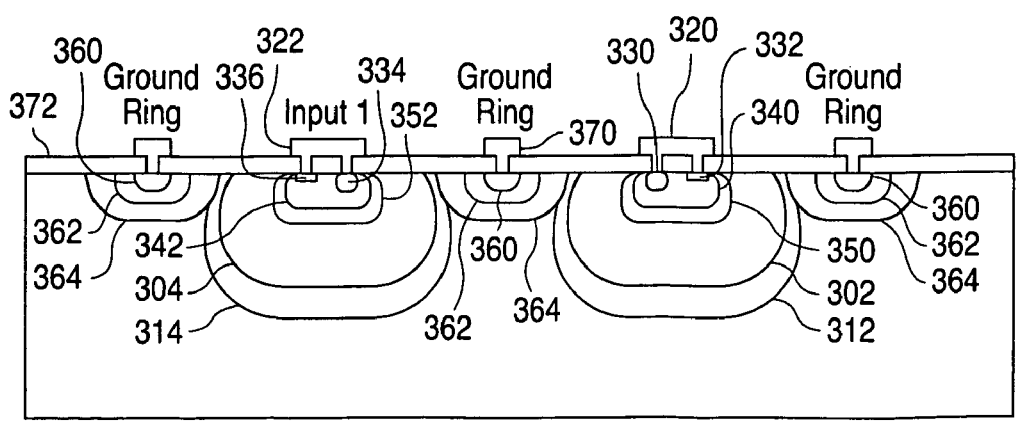
FIGS. 3–7 show cross sections through five embodiments of ESD protection structures of the invention.

FIG. 3 shows one embodiment of the present invention. The structure 300 comprises a symmetrical structure with two n-wells 302, 304 formed in a p-substrate 306. The n-wells 302, 304 are isolated from the p-substrate by n-isolation regions (NISO) 312, 314, respectively.

As shown in FIG. 3, the structure supports two poly input contact regions, 320, 322, each of which is connected to a n+ and a p+ input region formed in a p-well. As mentioned above, even though the term contact typically refers to the metal contact, the present application will use the term contact to refer to both the metal contact (not shown in the embodiments) as well as to the poly contact region. For simplicity, therefore, the poly contact regions shown in the Figures will simply be referred to as contacts. Thus, contact 320 is connected to p+ region 330 and n+ region 332 formed in p-well 340, while contact 322 is connected to p+ region 334 and n+ region 336, which are formed in p-well 342. As shown in FIG. 3, p-well 340 is formed in n-well 302, and p-well 342 is formed in n-well 304. P-well 340 has a p-buried layer (PBL) 350 formed below it while p-well 342 has PBL 352 formed below it. Thus, the structure provides support for two inputs, each of which are connected to a p+ and an n+ input region to handle dual voltage swings. The PBLs 350, 352 provide isolation between the n+ regions 332, 336, and the n-wells 302, 304, respectively, to avoid punch-through during negative ESD voltage pulses.

The NISOs 312, 314, in turn, provide punch-through isolation between the p+ regions 330, 334 and p-substrate 306 during positive ESD voltage pulses.

Figure 1:
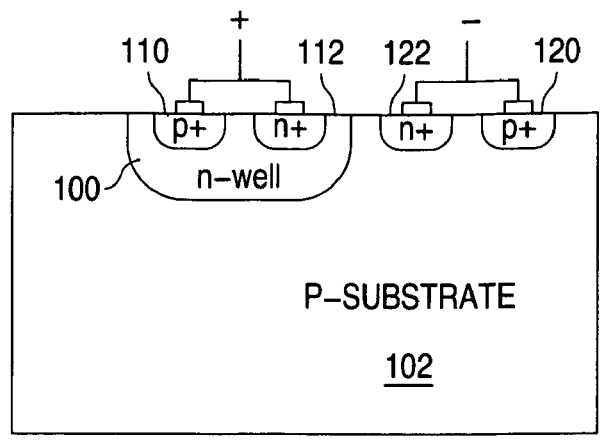
FIG. 1 shows a cross section through a typical SCR.

It will be noted that the structure of FIG. 3 differs from the SCR known in the art, shown in FIG. 1, in that the structure of FIG. 3 is symmetrical with two n-wells, a p-well in each n-well, and n+ and p+ regions connected to each input, thus handling both positive and negative ESD voltage pulses.

The embodiment of FIG. 3 further includes an isolation ring in the form of a p+ region 360. The p+ region is formed in a p-well 362, with a p-buried layer (PBL) 364 underneath the well 362. As shown in FIG. 3, the isolation ring extends between the n-wells 302, 304 and around them. Therefore, when viewed from the top (not shown), the isolation ring would surround the two n-wells 302, 304. The isolation ring is connected to ground (contact 370) as shown in FIG. 3 and serves as a ground connection independent of the two input contacts 320, 322. Thus the structure provides independent operation for both input pads (connected to the contacts 320, 322) relative to the substrate, and takes into account positive and negative voltage pulses to either of the two pads. An oxide layer 372 extends between the contacts 320, 322, 370.

Figure 2:
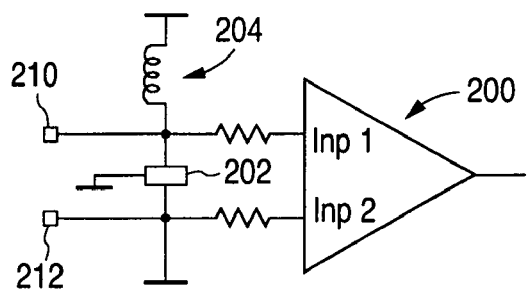
FIG. 2 is a simple schematic circuit diagram of a circuit with an inductive load.

The FIG. 3 embodiment provides snapback characteristics between the two inputs to contacts 320, 322, while the substrate can be grounded or biased at any desired potential relative to the two inputs. Thus the ESD device making use of the structure shown in FIG. 3 can have a grounded or separately biased isolation ring. Thus, this structure is well-suited for applications such as protecting the differential input pins 210, 212 in FIG. 2. The isolation ring provides latch-up isolation by reducing injection from the device junction to the internal circuitry. The PBL 364 helps in reducing cross-talk and latch up.

Figure 4:
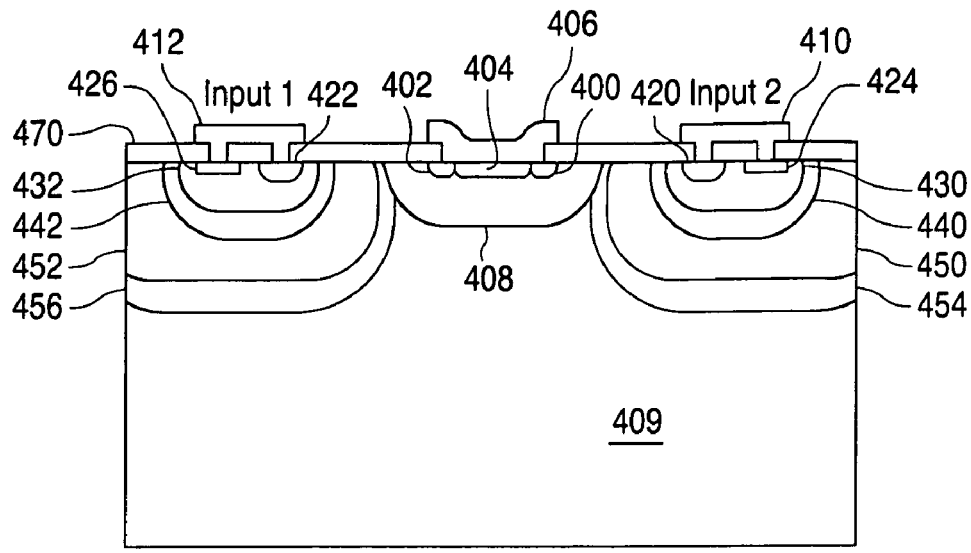
Figure 5:
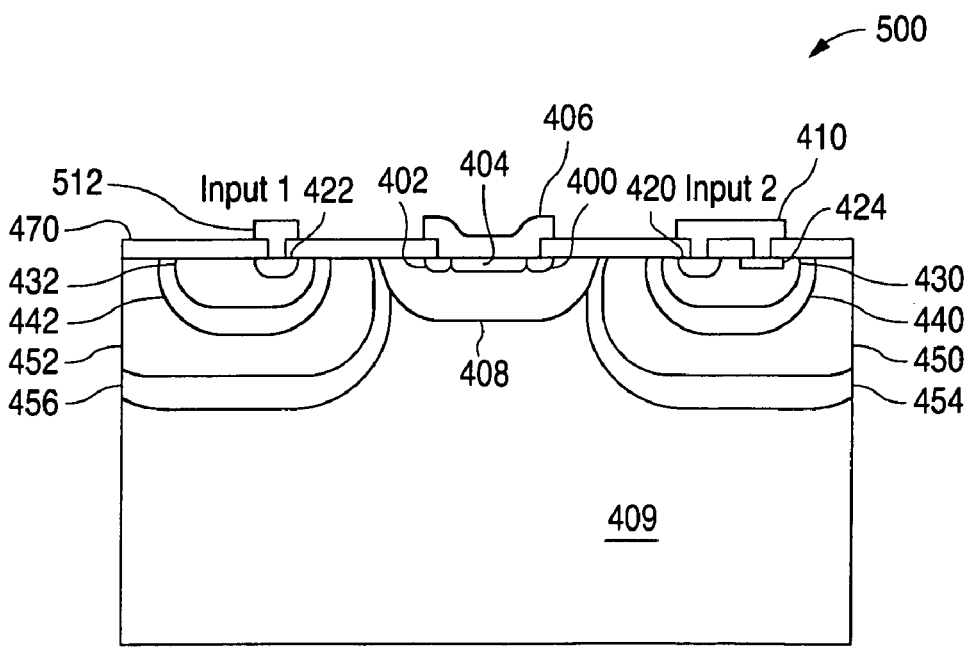
Figure 6:
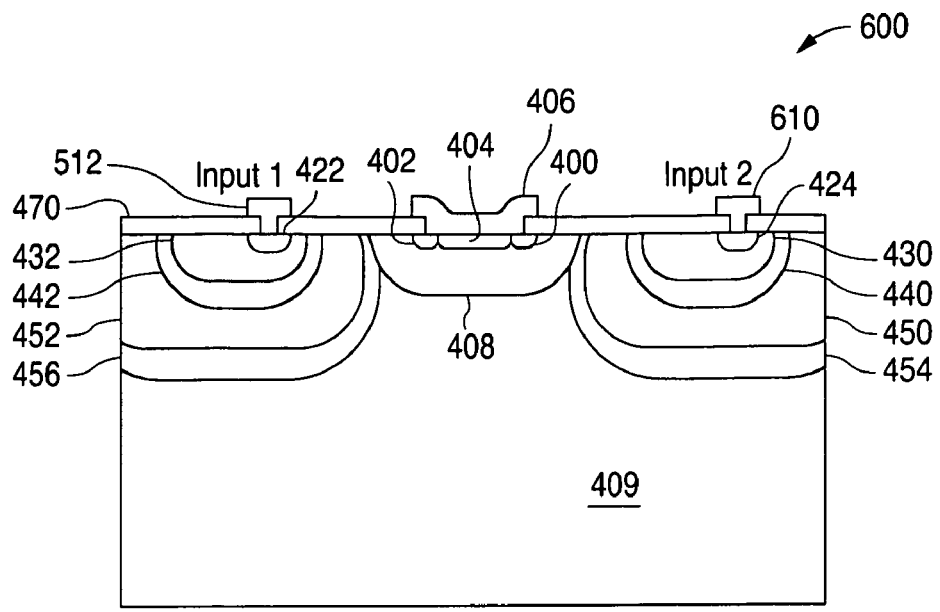

Another embodiment of the invention is shown in FIG. 4, which shows a structure similar to that of FIG. 3, but instead of only an isolation ring in the form of a p+ region, this embodiment includes an n+ ring in the middle of the p+ ring. FIG. 4, as well as FIGS. 5 and 6 show only the central part of the structure, it being understood that the isolation ring in each case extends around the two inputs. The FIG. 4 embodiment, in effect, has two p+ isolation rings 400, 402 formed on either side of an n+ ring 404. The rings 400, 402 can be connected to ground by means of a contact 406, as shown. However, other biasing of the contact 406 is also possible as is discussed below. As shown in FIG. 4, the p+ rings 400, 402 and n+ ring 404 are formed in a p-well 408 formed in p-substrate 409. As in the previous embodiment, there are two inputs regions with contacts 410, 412, (other than contact 406). Each input region includes a p+ region and an n+ region (p+ regions 420, 422, and n+ regions 424, 426). The p+ regions 420, 422 and n+ regions 424, 426 are formed in p-wells 430, 432 as shown, with a PBL 440, 442 under each of the p-wells to prevent punch through during negative voltage pulses, as was discussed above with respect to the FIG. 3 embodiment. Also, this embodiment has n-wells 450, 452 with NISO regions 454, 456 formed below the n-wells 450, 452, respectively to provide punch through protection during positive voltage pulses. It will be appreciated that the symmetrical structure of FIG. 4 again provides for dual polarity protection, hence the isolation provided by the PBLs 440, 442, and NISOs 454, 456. An oxide layer 470 is provided between the contacts 406, 410, 412. By including an n+ ring 404 between p− rings 400, 402, the isolation ring defines a thyristor, not only the Zener diode device for the current path from the inputs to ground, which may be a floating ground node. In the FIG. 4 embodiment, there is no PBL below the p-well 408 since the isolation ring in this embodiment is connected to a grounded pad. In an embodiment where it is connected merely to an internal ground node, a PBL is preferably included below the p-well 408 of the isolation ring.

Yet another embodiment of the invention is shown in FIG. 5. This embodiment has a structure similar to that in FIG. 4, hence, like elements are given the same reference numerals as in FIG. 4. The FIG. 5 embodiment (structure 500), however differs from the one in FIG. 4 in that the n+ region 426 of FIG. 4 is not present in structure 500. Thus the one input region still includes a n+ and a p+ region 420, 424, while the other input region only includes a p+ region 422. Accordingly, contact 512 is smaller than contact 412.

The rest of the structure is essentially the same as in the FIG. 4 embodiment. As in the FIG. 4 embodiment, the structure 500 has an isolation ring comprising two p+ rings 400, 402, and an n+ ring 404 is formed between the rings 400, 402. The isolation rings 400, 402 are connected to ground by means of a contact 406. As shown in FIG. 5, the p+ rings 400, 402 and n+ ring 404 are formed in a p-well 408, which is formed in p-substrate 409. Other than contact 406, there are two contacts 410, 512, the first of which is connected to a p+ region and an n+ region (p+ regions 420, and n+ regions 424). The latter (contact 512) is connected only to the p+ region 422) The p+ regions 420, 422 and n+ region 424, are formed in p-wells 430, 432 as shown, with a PBL 440, 442 under each of the p-wells to prevent punch through during negative voltage pulses. It will be appreciated that if the input to contact 512 is not expected to see negative voltages, the PBL 442 is not necessary. Also, this embodiment has n-wells 450, 452 with NISO regions 454, 456 formed below the n-wells 450, 452, respectively to provide punch through protection during positive voltage pulses. It will be appreciated that only in the case of a positive voltage pulse to the contact 512 will the structure 500 demonstrate SCR behavior. On the other hand, contact 410, which is connected to both a n+ and a p+ region, provides for dual polarity protection. An oxide layer 470 is provided between the contacts 406, 410, 412.

Yet another embodiment is shown in FIG. 6, which is similar to the FIG. 5 embodiment and therefore the same reference numerals have been used for like elements. This embodiment (structure 600) differs from FIG. 5 in that the p+ region 420 has been eliminated and the to the n+ region 424 (contact 610) has been reduced in size. The rest of the structure is essentially the same as in the FIG. 5 embodiment. As in the FIG. 5 embodiment, the structure 600 has an isolation ring comprising two p+ rings 400, 402. These are typically connected to ground and act as isolation rings. In addition to the p+ isolation rings there is an n+ ring 404. The isolation rings 400, 402 are connected to ground by means of a contact 406. As shown in FIG. 6, the p+ isolation rings 400, 402 and n+ ring 404 are formed in a p-well 408, which is formed in p-substrate 409. Other than contact 406, there are two contacts 610, 512, the first of which is connected to a n+ region (n+ regions 424). The latter (contact 512) is connected to a p+ region 422). The n+ region 424 and p+ region 422, are formed in p-wells 430, 432 as shown, with a PBL 440, 442 under each of the p-wells to prevent punch through during negative voltage pulses.

Also, this embodiment has n-wells 450, 452 with NISO regions 454, 456 formed below the n-wells 450, 452, respectively to provide punch through protection during positive voltage pulses. It will be appreciated that only in the case of a positive voltage pulse to the contact 512 and a negative voltage pulse to the contact 610 will the structure 600 demonstrate SCR behavior. An oxide layer 470 is provided between the contacts 406, 410, 412.

The nature of the architecture of the present invention provides for an added advantage. By making use of a simple structure requiring only a single poly contact layer and metal contact layer for the anode, cathode and isolation ring, a space saving can be achieved by placing the entire structure under the bond pad. Each pad is approximately 100 μm×100 μm in area, and by using the simple architecture described above, bonding and probing will typically not damage the polysilicon contact layer, thus allowing the entire structure to be formed under a bond pad.

Figure 7:
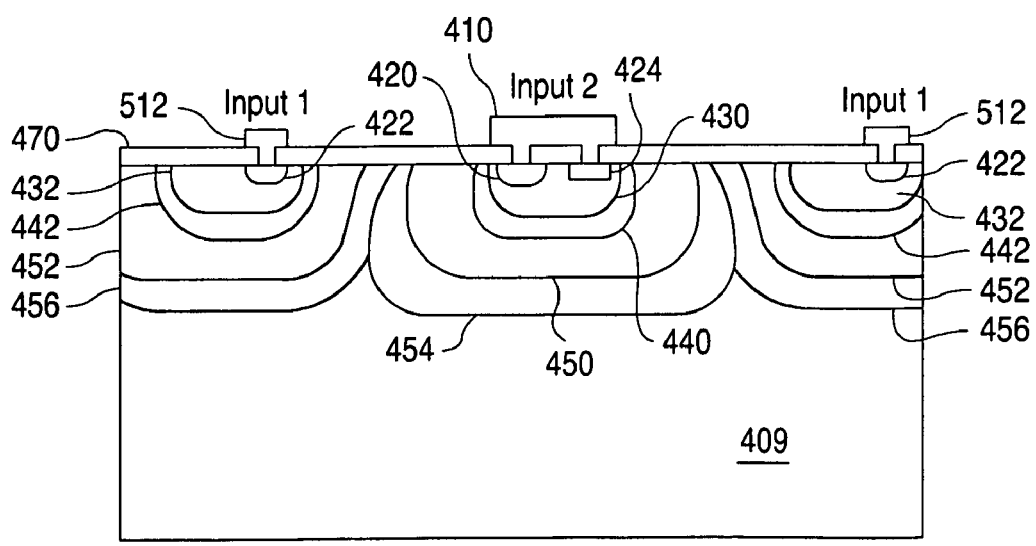

In yet another embodiment, some space saving is achieved by eliminating the separate isolation ring. Typically the isolation ring and spacings between the active or input regions (cathode or anode) and the ring are rather large, e.g. 3, 5, and 10 μm and even larger. Where the isolation ring extends around both the active regions (which will be referred to also as anode and cathode in this application) as in the FIG. 3 embodiment, this can represent a substantial use of space. Where one of the active regions (either the anode or the cathode) is grounded, a space saving can be achieved by providing the grounded anode or cathode in the form of a ring or partial ring that extends fully or partially around the other active region. Thus, the ring-shaped active region can itself serve as the isolation ring to reduce latch-up. This avoids the need for a separate isolation ring. Such an embodiment is shown in FIG. 7 where the cathode 700 forms an isolation ring around anode 702. For ease of illustration, the same reference numerals were used for like structures as in FIG. 5.

While specific embodiments have been described above, it will be appreciated that variations can be adopted without departing from the scope of the invention as defined by the claims. For instance, where an input only includes a n+ region, no NISO is needed to prevent punch through of positive voltage pulses. Similarly, where the input only includes a p+ region, no protection against negative punch through is needed. Hence, no PBL is needed under the p-well in which the p+ region is formed. It will, for instance, be appreciated that an embodiment could have a n+ and a p+ region for one input and only a n+ region for the other input.

What is claimed is:

1. A multiple input ESD protection structure comprising
a first p-well formed in a first n-well,
a second p-well formed in a second n-well,
an isolation ring between the n-wells and extending around the two n-wells, the isolation ring comprising a p+ ring,
a first input region formed in the second p-well,
a second input region formed in the second p-well,
a contact to the first input region,
a contact to the second input region, and
a contact to the isolation ring, wherein the first and second input regions each comprises at least one of an n+ region and a p+ region wherein at least one of the first and second input regions includes a p+ region and an n+ region.

2. A structure of claim 1, further comprising an n-isolation region (NISO) formed beneath at least one of the n-wells.

3. A structure of claim 2, further comprising a p-buried layer (PBL) formed beneath at least one of the first and second p-wells.

4. An ESD protection device that comprises
a first p-well formed in a first n-well,
a second p-well formed in a second n-well,
an isolation ring between then-wells and extending around the two n wells, the isolation ring comprising a p+ ring,
a first input region formed in the first p-well,
a second input region formed in the second p-well,
a contact to the first input region,
a contact to the second input region, and
a contact to the isolation ring, wherein the isolation ring is connectd to ground or is biased to a predefined voltage wherein the first and second input regions each comprises at least one of an n+ region and a p+ region.

* * * * *